United States Patent
Lee

(10) Patent No.: US 7,880,242 B2
(45) Date of Patent: Feb. 1, 2011

(54) SEMICONDUCTOR DEVICE AND METHOD OF FABRICATING THE SAME

(75) Inventor: Han Choon Lee, Poongnap-dong (KR)

(73) Assignee: Dongbu Hitek Co., Ltd., Seoul (KR)

( * ) Notice: Subject to any disclaimer, the term of this patent is extended or adjusted under 35 U.S.C. 154(b) by 567 days.

(21) Appl. No.: 11/876,010

(22) Filed: Oct. 22, 2007

(65) Prior Publication Data
US 2008/0157230 A1    Jul. 3, 2008

(30) Foreign Application Priority Data
Dec. 27, 2006  (KR) ................ 10-2006-0135635

(51) Int. Cl.
*H01L 29/78*    (2006.01)
*H01L 21/336*  (2006.01)

(52) U.S. Cl. .................. 257/410; 438/287

(58) Field of Classification Search ......... 257/204, 257/274, E27.062–E29.067, E27.108, 369, 257/410, 288, 412, 413, E29.155–E29.161, 257/E21.621, E21.623, E21.635; 438/277, 438/287, 585, 587, 588, 592
See application file for complete search history.

(56) References Cited

U.S. PATENT DOCUMENTS

| 6,387,767 | B1 * | 5/2002 | Besser et al. ............ 438/305 |
| 7,033,888 | B2 * | 4/2006 | Pan et al. ............... 438/257 |
| 2008/0105920 | A1 * | 5/2008 | Hirano et al. ............ 257/327 |

OTHER PUBLICATIONS http://www.mrs.org/s_mrs/sec_subscribe.asp?CID=6467&DID=176363&action=detail&css=print.*

* cited by examiner

*Primary Examiner*—Dao H Nguyen
*Assistant Examiner*—Tram H Nguyen
(74) *Attorney, Agent, or Firm*—Saliwanchik, Lloyd & Saliwanchik

(57) ABSTRACT

A semiconductor device and a fabricating method thereof are provided. The semiconductor device includes a gate insulating layer with a high dielectric constant (k) and a polysilicon layer on a gate metal layer. The gate metal layer can include silicon atoms. Electron mobility can be improved, and production residue and damage can be minimized.

9 Claims, 3 Drawing Sheets

SEMICONDUCTOR DEVICE AND METHOD OF FABRICATING THE SAME

CROSS-REFERENCE TO RELATED APPLICATION

The present application claims the benefit under 35 U.S.C. §119 of Korean Patent Application No. 10-2006-0135635, filed Dec. 27, 2006, the subject matter of which is hereby incorporated by reference.

BACKGROUND

As information media devices, such as computers, become more popular and widely used, the semiconductor industry becomes more important. Semiconductor devices generally operate at high speeds and have large storage capacities and information processing capabilities. In order to achieve these characteristics, semiconductor manufacturing technology has been developed to attempt to improve the degree of integration, reliability, and response velocity.

As semiconductor devices become highly integrated with large capacities, gate oxide layers used in fabricating complimentary metal oxide semiconductor field effect transistor (CMOSFET) devices become thinner.

Silicon oxide ($SiO_2$) has typically been used as a material for the gate oxide layer.

Silicon oxide is often used as the gate oxide layer because it displays good thermal stability and reliability and is easily fabricated.

However, since silicon oxide has a low dielectric constant of about 3.9, gate leakage current often occurs due to the reduction in thickness of the gate oxide layer. The thickness of the silicon oxide layer is generally decreased to allow for semiconductor devices to be highly integrated.

Therefore, the use of a high-k material as a gate insulating layer has recently been considered.

A gate insulating layer made of a high-k material is often used as a metal gate electrode including TaN or TiN. When forming such a metal gate electrode, many residues are typically produced during an etching process. These residues may cause subsequent processes in a semiconductor device to fail.

Furthermore, since a large number of carbon (C) and oxygen (O) radicals are often combined in the metal gate electrode, the mobility of electrons is reduced, thereby degrading the performance of a transistor.

Thus, there exists a need in the art for an improved semiconductor device and fabricating method thereof.

BRIEF SUMMARY

Embodiments of the present invention provide a semiconductor device having a gate insulating layer with a high dielectric constant (k) and a method of fabricating the semiconductor device.

In an embodiment, a semiconductor device can include: a gate insulating layer on a semiconductor substrate; a gate metal layer on the gate insulating layer and containing silicon; and a polysilicon layer on the gate metal layer.

A gate insulating layer can be formed on a semiconductor substrate, and a preliminary metal layer can be formed on the gate insulating layer. Gas, such as $SiH_4$ gas, can be flowed on the preliminary metal layer, and an annealing process can be performed to form a gate metal layer containing silicon. A polysilicon layer can be formed on the gate metal layer containing silicon, and then the polysilicon layer, the gate metal layer, and the gate insulating layer can be patterned to form a gate pattern.

Other systems, methods, features and advantages will be, or will become, apparent to one with skill in the art upon examination of the figures, the detailed description, and the appended claims.

DETAILED DESCRIPTION

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

The semiconductor device according to an embodiment can be a complimentary metal oxide semiconductor field effect transistor (CMOSFET) device.

Figure 1:
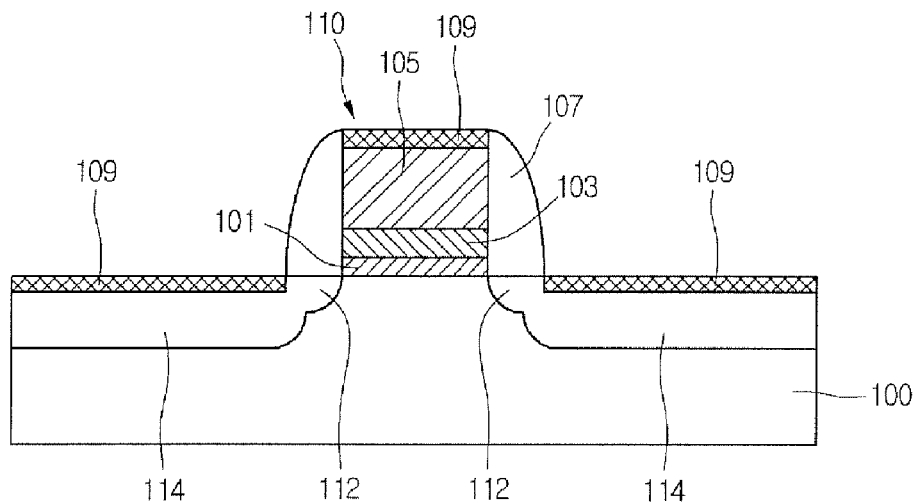
FIG. 1 is a cross-sectional view of a semiconductor device according to an embodiment of the present invention.

Referring to FIG. 1, a gate pattern 110 can be formed on an active area of a semiconductor substrate 100.

The active area can be defined by an isolation region (not shown) formed in the semiconductor substrate 100.

The gate pattern 110 can include a gate insulating layer 101 with a high dielectric constant (k) on the semiconductor substrate 100 and a gate metal layer 103 on the gate insulating layer 101. A polysilicon layer 105 can be on the gate metal layer 103.

In an embodiment, the gate insulating layer 101 can include, for example, $SiO_2$, HfN, HfOSiN, HfSiO, HfON, or any combination thereof.

In an embodiment, the gate metal layer 103 can be a metal layer containing silicon (Si) particles.

For example, the gate metal layer 103 can be a TaSiN layer.

The thickness of the gate metal layer 103 can be, for example, from about 2 nm to about 30 nm.

Ions can be implanted into the gate metal layer 103. For example, arsenic (As) ions, boron (B) ions, phosphorous (P) ions, or any combination thereof can be implanted into the gate metal layer 103 though an ion implantation process.

The ion implantation process can be performed such that the gate metal layer 103 has a large work function.

The thickness of the polysilicon layer 105 can be, for example, from about 20 nm to about 120 nm.

Gate spacers 107 can be provided on sidewalls of the gate pattern 110.

Each gate spacer 107 can include, for example, an oxide layer or a nitride layer. In an embodiment, each gate spacer 107 can include a double layer in which an oxide layer and a nitride layer are stacked together.

Low-density source/drain areas 112 can be beneath the gate spacers 107.

Impurities can be implanted onto the semiconductor substrate 100 at both sides of the gate pattern 110 and the gate spacers 107, using the gate pattern 110 and the gate spacers

107 as a mask, such that high-density source/drain areas 114 are formed at sides of the gate pattern 110 and gate spacers 107.

A silicide layer 109 can be on the polysilicon layer 105 and the high-density source/drain areas 114.

In certain embodiments, when a metal gate includes a gate pattern 110 with a high-k gate insulating layer 101, stable and improved characteristics of the semiconductor device can be obtained. Additionally, using a TaSiN gate metal layer 103 can further improve device characteristics. Moreover, a polysilicon layer deposited on the gate metal layer can help form a stable metal gate.

For example, silicon particles in a TaSiN gate metal layer 103 can improve interface characteristics with a high-k gate insulating layer 101. Since a TaSiN gate metal layer 103 does not inhibit electron channel flow, electron mobility can be improved.

Furthermore, in embodiments with a gate pattern 110 having a polysilicon layer 105, the polysilicon layer 105 can be used as a hard mask during fabrication, leading to a reduction in the production of residues. Thus, a stable metal gate with minimal to no damage can be formed.

FIGS. 2A to 2F are cross-sectional views sequentially illustrating a method of fabricating a semiconductor device according to an embodiment.

Figure 2A:
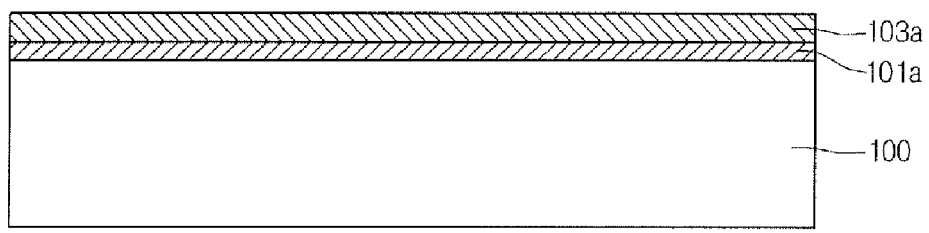
FIGS. 2A to 2F are cross-sectional views illustrating a method of fabricating a semiconductor device according to an embodiment of the present invention.

Referring to FIG. 2A, a gate insulating layer 101a made of a high-k material can be deposited on a semiconductor substrate 100.

In an embodiment, the gate insulating layer 101a can include $SiO_2$, HfN, HfOSiN, HfSiO, HfON, or any combination thereof.

In one embodiment, the gate insulating layer 101a can be deposited using $Hf[N(CH_3)C_2H_5]_4$ as a precursor.

The temperature in the deposition of the gate insulating layer 101a can be, for example, about 200° C. to about 350° C.

The gate insulating layer 101a can be deposited to a thickness of, for example, about 2 nm to about 6 nm.

Then, a preliminary gate metal layer can be formed on the gate insulating layer 101a.

The preliminary gate metal layer can be, for example, a TaN layer.

The preliminary gate metal layer can be deposited, for example, through atomic layer deposition (ALD).

A gate metal layer 103a can be formed by performing a treatment on the preliminary gate metal layer. Deposition and treatment processes can be repeatedly formed, if needed.

In embodiments where the preliminary gate metal layer is a TaN layer, a treatment can be performed on the TaN layer to form a TaSiN layer.

In an embodiment, the TaN layer can be deposited on the gate insulating layer 101a through ALD.

A chemical material for forming a TaN layer can include pentakis(ethylmethylamido)tantalum (PEMAT), pentakis(dimethylamido)tantalum (PDMAT), tertbutylimidotris(diethylamido)tantalum (TBTDET), tantalum fluoride ($TaF_5$), or any other appropriate material known in the art.

The deposition temperature of a TaN layer can be about 100° C. to about 200° C.; the deposition time of a TaN layer can be about 2 seconds to about 10 seconds, and the thickness of a TaN layer can be about 0.5 Å to about 1.5 Å. The TaN layer can be formed through a plasma treatment using, for example, $H_2$ gas, $NH_3$ gas, $H_2+NH_3$ gas, or any combination thereof.

In an embodiment, the plasma treatment can be performed at a frequency of about 13.56 MHz. In an alternative embodiment, the plasma treatment can be performed at a frequency of about 100 Hz to about 500 Hz.

During the plasma treatment, the rate of injected gases can be, for example, about 10 standard cubic centimeters per minute (seem) to about 200 sccm.

The gate metal layer 103a containing silicon particles can be formed by flowing $SiH_4$ gas on the preliminary gate metal layer. The $SiH_4$ can be flowed on the preliminary gate metal layer in an ALD chamber. Also, an annealing process can be performed.

For example, a TaSiN layer can be formed by flowing $SiH_4$ gas on a TaN layer and performing an annealing process.

Carbon (C) and oxygen (O) radicals contained in the preliminary gate metal layer can be removed and combined with silicon (Si) radicals. The gate metal layer 103a, such as a TaSiN layer, can have good interface characteristics with the high-k gate insulating layer 101a formed below.

In an embodiment, the annealing process can be performed at a temperature of about 100° C. to about 450° C. for a period of time of about 5 seconds to about 30 seconds.

In an embodiment, the $SiH_4$ gas can be provided at a rate of about 20 sccm to about 150 sccm.

The chamber pressure in the annealing process can be, for example, about 1 mTorr to about 5 Torr.

The thickness of the gate metal layer 103a can be about 2 nm to about 30 nm.

The process of forming the gate metal layer 103a described above can be referred to as a one cycle. Multiple cycles can be performed as desired.

Figure 2B:
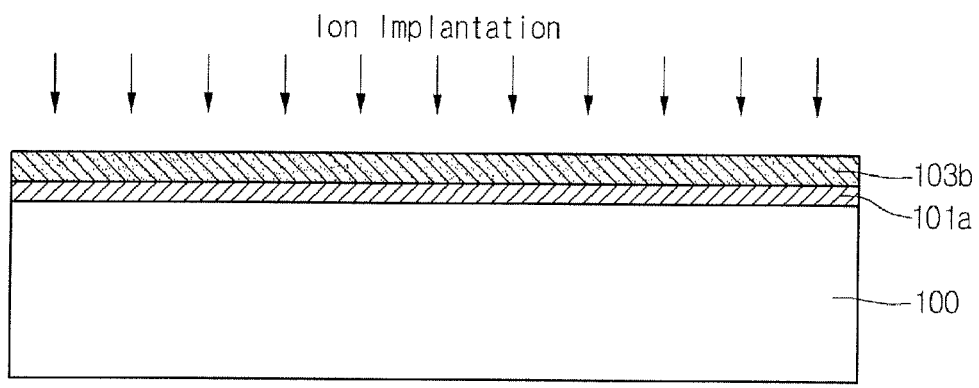

Referring to FIG. 2B, an ion implantation process can be performed on the gate metal layer 103a.

The ion implantation process can be performed such that the gate metal layer 103a has a large work function. In an embodiment, As ions, B ions, P ions, or any combination thereof can be implanted into the gate metal layer 103a.

In embodiments where As ions are implanted into the gate metal layer 103a, the ion implantation process can be performed, for example, with an energy of about 3 keV to about 10 keV at a dosage of about $1\times10^{15}$ atoms/$cm^2$ to about $1\times10^{16}$ atoms/$cm^2$, with a tilt angle of about 0 degrees and a twist angle of about 0 degrees.

In embodiments where B ions are implanted into the gate metal layer 103a, the ion implantation process can be performed with an energy of about 1 keV to about 5 keV at a dosage of about $1\times10^{15}$ atoms/$cm^2$ to about $1\times10^{16}$ atoms/$cm^2$, with a tilt angle of about 0 degrees and a twist angle of about 0 degrees.

In embodiments where P ions are implanted into the gate metal layer 103a, the ion implantation process can be performed with an energy of about 3 keV to about 7 keV at a dosage of about $1\times10^{15}$ atoms/$cm^2$ to about $1\times10^{16}$ atoms/$cm^2$, with a tilt angle of about 0 degrees and a twist angle of about 0 degrees.

Figure 2C:
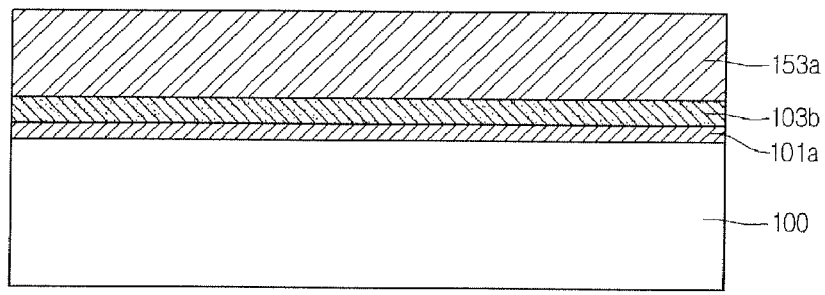

Referring to FIG. 2C, polysilicon can be deposited on the ion-implanted gate metal layer 103b to form a polysilicon layer 153a.

The thickness of the polysilicon layer 153a can be, for example, between about 20 nm and about 120 nm.

Figure 2D:
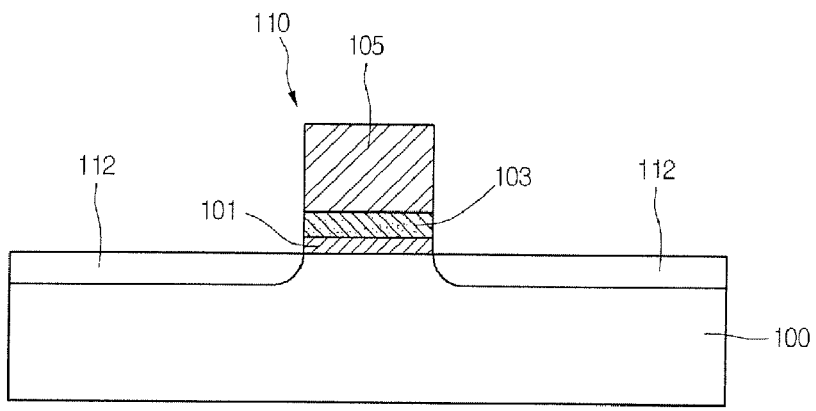

Referring to FIG. 2D, a gate pattern 110 can be formed by patterning the polysilicon layer 153a, the ion-implanted gate metal layer 103b and the gate insulating layer 101a.

The patterned polysilicon layer 105 can be a capping layer and can serve as a hard mask.

At this time, the polysilicon layer 153a, the ion-implanted gate metal layer 103b and the gate insulating layer 101a can be etched and then patterned through a plasma etching process. In an embodiment, HBr can be used as an etching gas.

Ions can be implanted onto the semiconductor substrate 100 at both sides of the gate pattern 110 to form low-density source/drain areas 112.

The ion implantation process can be performed using the gate pattern 110 as a mask.

In an embodiment, n-type impurity ions can be implanted, and an n-well can be covered by a mask layer. In an alternative embodiment, p-type impurity ions can be implanted, and a p-well can be covered by a mask layer.

In an embodiment, low-density n-type source/drain areas 112 can be formed in a p-well at both sides of an NMOS gate pattern, and low-density p-type source/drain areas can be formed in a n-well at both sides of a PMOS gate pattern.

Figure 2E:
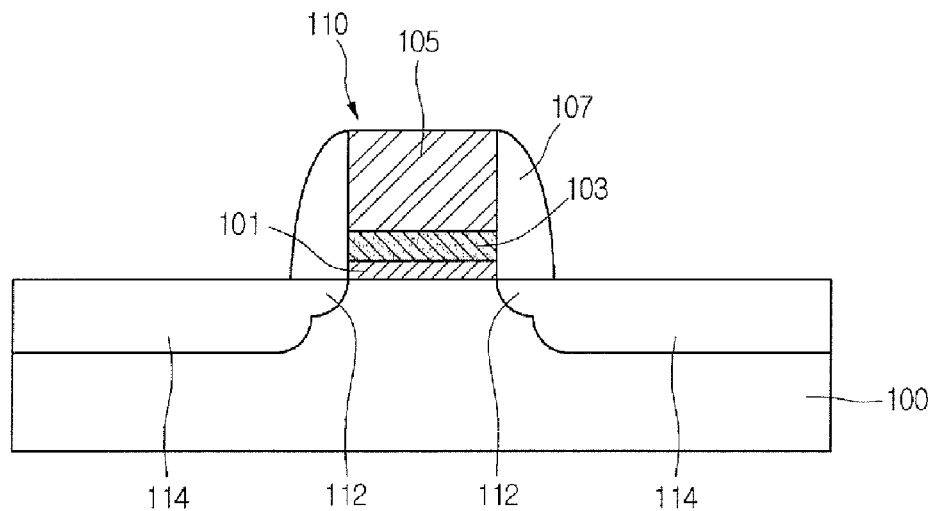

Referring to FIG. 2E, gate spacers 107 can be formed on both sides of the gate pattern 110.

In an embodiment, each gate spacer 107 can include an oxide layer or a nitride layer. In a further embodiment, each gate spacer 107 can include a double layer in which an oxide layer and a nitride layer can be stacked together.

In an embodiment, NMOS gate spacers can be formed on sidewalls of an NMOS, and PMOS gate spacers can be formed on sidewalls of a PMOS gate pattern.

Ions can be implanted onto the semiconductor substrate 100 at both sides of the gate pattern 110 and the gate spacers 107, using the gate pattern 110 and the gate spacers 107 as a mask, to form high-density source/drain areas 114.

In an embodiment, an n-well can be covered by a mask layer, and high-density n-type impurity ions can be implanted into a p-well using an NMOS gate pattern and NMOS gate spacers as a mask.

Thus, high-density n-type source/drain areas can be formed in a p-well at both sides of an NMOS gate pattern and NMOS gate spacers.

In an embodiment, a p-well can be covered by a mask layer, and high-density p-type impurity ions can be implanted into an n-well using a PMOS gate pattern and PMOS gate spacers as a mask.

Thus, high-density p-type source/drain areas can be formed in an n-well at both sides of a PMOS gate pattern and PMOS gate spacers.

Figure 2F:
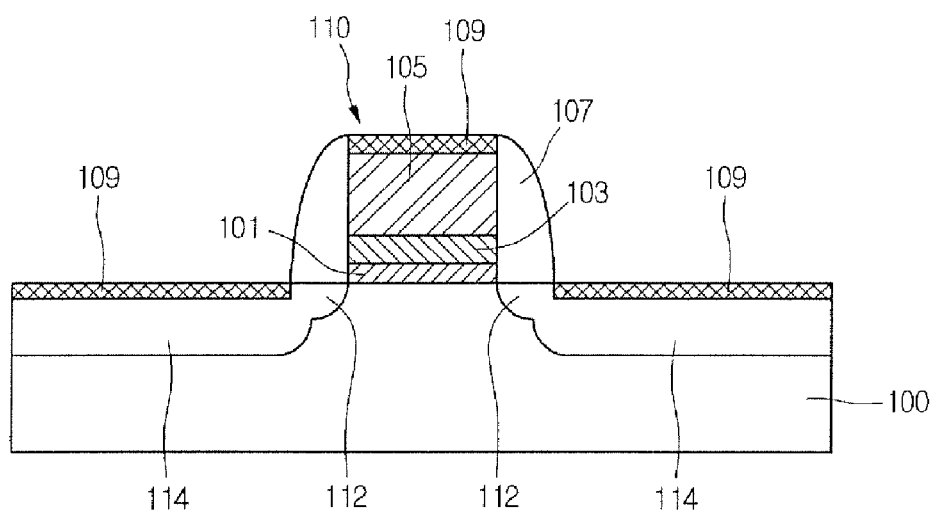

Referring to FIG. 2F, a silicide metal layer can be formed on the semiconductor substrate 100 after forming the gate pattern 110 and finishing an ion implantation process. The silicide metal layer can include, for example, cobalt (Co) or nickel (Ni). A silicide process can be performed by annealing the silicide metal layer.

Accordingly, a silicide layer 109 can be formed on the polysilicon layer 105 and source/drain areas 114.

The annealing process can be rapid thermal annealing (RTA), rapid thermal processing (RTP), step annealing, or any other appropriate annealing process known in the art.

In embodiments where step annealing is performed, a gate step can be performed at a temperature of about 300° C. to about 700° C., and a second step can be performed at a temperature of about 400° C. to about 850° C.

A semiconductor device having the gate pattern according to embodiments of the present invention can include a high-k gate insulating layer and a TaSiN layer formed on the gate insulating layer as a metal gate Interface characteristics between the metal gate and the gate insulating layer can be improved, and electron mobility can be enhanced.

Additionally, according to embodiments, a metal gate can be patterned using polysilicon, thereby forming a stable metal gate with minimal to no damage or residues such as carbon and oxygen. Thus, the reliability of subsequent process to be performed on the device can be improved.

Any reference in this specification to "one embodiment," "an embodiment," "example embodiment," etc., means that a particular feature, stricture, or characteristic described in connection with the embodiment is includes in at least one embodiment of the invention. The appearances of such phrases in various places in the specification are not necessarily all referring to the same embodiment. Further, when a particular feature, structure, or characteristic is described in connection with any embodiment, it is submitted that it is with in the purview of one skilled in the art to effect such feature, structure, or characteristic in connection with other ones of the embodiments.

Although embodiments have been described with reference to a number of illustrative embodiments, thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of fabricating a semiconductor device, comprising:

forming a gate insulating layer on a semiconductor substrate;

forming a TaN layer on the gate insulating layer;

flowing a gas on the TaN layer, wherein the gas comprises silicon;

performing an annealing process on the TaN layer to form a TaSiN layer comprising silicon;

forming a polysilicon layer on the TaSN layer; and patterning the polysilicon layer, the TaSiN layer, and the gate insulating layer to form a gate pattern using the polysilicon layer as a hard mask.

2. The method according to claim 1, wherein the gas is $SiH_4$.

3. The method according to claim 1, further comprising:

forming low-density source and drain areas on the semiconductor substrate using the gate pattern as a first mask;

forming spacers on sides of the gate pattern; and forming high-density source and drain areas on the semiconductor substrate using the gate pattern and the spacers as a second mask.

4. The method according to claim 1, further comprising implanting ions into the TaSiN layer, and wherein the ions are As ions, B ions, P ions, or any combination thereof.

5. The method according to claim 1, wherein the annealing process is performed at a temperature between about 100° C. and about 450° C. for a period of time of about 5 seconds to about 30 seconds.

6. The method according to claim 1, wherein the gas flows at a rate of about 20 standard cubic centimeters per minute (sccm) to about 150 sccm.

7. The method according to claim 1, wherein the annealing process is performed in a chamber, and wherein the chamber has a pressure of about 1 mTorr to about 5 Torr.

8. The method according to claim 1, wherein the TaN layer comprises pentakis(ethylmethylamido)tantalum (PEMAT), pentakis(dimethylamido)tantalum (PDMAT), tertbutylimidotris(diethylamido)tantalum (TBTDET), tantalum fluoride ($TaF_5$), or any combination thereof.

9. The method according to claim 1, wherein the gate insulating layer comprises $SiO_2$, HfN, HfOSiN, HfSiO, HfON, or any combination thereof.

* * * * *